US010847644B2

(12) United States Patent
Kinzer et al.

(10) Patent No.: US 10,847,644 B2
(45) Date of Patent: Nov. 24, 2020

(54) GALLIUM NITRIDE TRANSISTOR WITH IMPROVED TERMINATION STRUCTURE

(71) Applicant: NAVITAS SEMICONDUCTOR, INC., El Segundo, CA (US)

(72) Inventors: Daniel M. Kinzer, El Segundo, CA (US); Maher J. Hamdan, Lake Forest, CA (US)

(73) Assignee: NAVITAS SEMICONDUCTOR LIMITED, Dublin (IE)

( * ) Notice: Subject to any disclaimer, the term of this patent is extended or adjusted under 35 U.S.C. 154(b) by 0 days.

(21) Appl. No.: 16/391,731

(22) Filed: Apr. 23, 2019

(65) Prior Publication Data
US 2019/0326427 A1  Oct. 24, 2019

Related U.S. Application Data

(60) Provisional application No. 62/661,585, filed on Apr. 23, 2018.

(51) Int. Cl.
| | |
|---|---|
| *H01L 29/778* | (2006.01) |
| *H01L 29/40* | (2006.01) |
| *H01L 29/20* | (2006.01) |
| *H01L 29/06* | (2006.01) |
| *H01L 29/205* | (2006.01) |
| *H01L 29/423* | (2006.01) |

(52) U.S. Cl.
CPC ...... *H01L 29/7787* (2013.01); *H01L 29/0696* (2013.01); *H01L 29/2003* (2013.01); *H01L 29/205* (2013.01); *H01L 29/404* (2013.01); *H01L 29/42356* (2013.01); *H01L 29/7786* (2013.01)

(58) Field of Classification Search
CPC ............. H01L 29/7787; H01L 29/7786; H01L 29/2003; H01L 29/205; H01L 29/402; H01L 29/404; H01L 29/66431
See application file for complete search history.

(56) References Cited

U.S. PATENT DOCUMENTS

| 4,549,336 A | 10/1985 | Sheppard |
| 4,612,560 A | 9/1986 | Dortu et al. |
| 2011/0215379 A1* | 9/2011 | Ikoshi ................ H01L 29/7786 257/194 |

(Continued)

FOREIGN PATENT DOCUMENTS

| JP | 2007027284 A | 2/2007 |
| JP | 2011181743 A | 9/2011 |
| JP | 2015122544 A | 7/2015 |

OTHER PUBLICATIONS

U.S. Appl. No. 16/391,670, "Non-Final Office Action", dated Aug. 30, 2019, 18 pages.

(Continued)

*Primary Examiner* — Phat X Cao
(74) *Attorney, Agent, or Firm* — Kilpatrick Townsend & Stockton LLP

(57) ABSTRACT

A gallium nitride transistor includes one or more P-type hole injection structures that are positioned between the gate and the drain. The P-type hole injection structures are configured to inject holes in the transistor channel to combine with trapped carriers (e.g., electrons) so the electrical conductivity of the channel is less susceptible to previous voltage potentials applied to the transistor.

18 Claims, 13 Drawing Sheets

(56) References Cited

U.S. PATENT DOCUMENTS

| | | | |
|---|---|---|---|
| 2014/0138704 A1* | 5/2014 | Tanaka | H01L 29/41725 |
| | | | 257/76 |
| 2015/0162424 A1 | 6/2015 | Briere | |
| 2015/0249134 A1 | 9/2015 | Ostermaier et al. | |
| 2016/0035853 A1* | 2/2016 | Kaneko | H01L 21/28 |
| | | | 257/194 |
| 2017/0338316 A1 | 11/2017 | Yao et al. | |
| 2018/0138306 A1* | 5/2018 | Jeon | H01L 29/66462 |
| 2018/0197999 A1 | 7/2018 | Palacios et al. | |

OTHER PUBLICATIONS

U.S. Appl. No. 16/391,731, "Restriction Requirement", dated Jul. 22, 2019, 7 pages.

U.S. Appl. No. 16/391,670, "Final Office Action", dated Jan. 16, 2020, 23 pages.

* cited by examiner

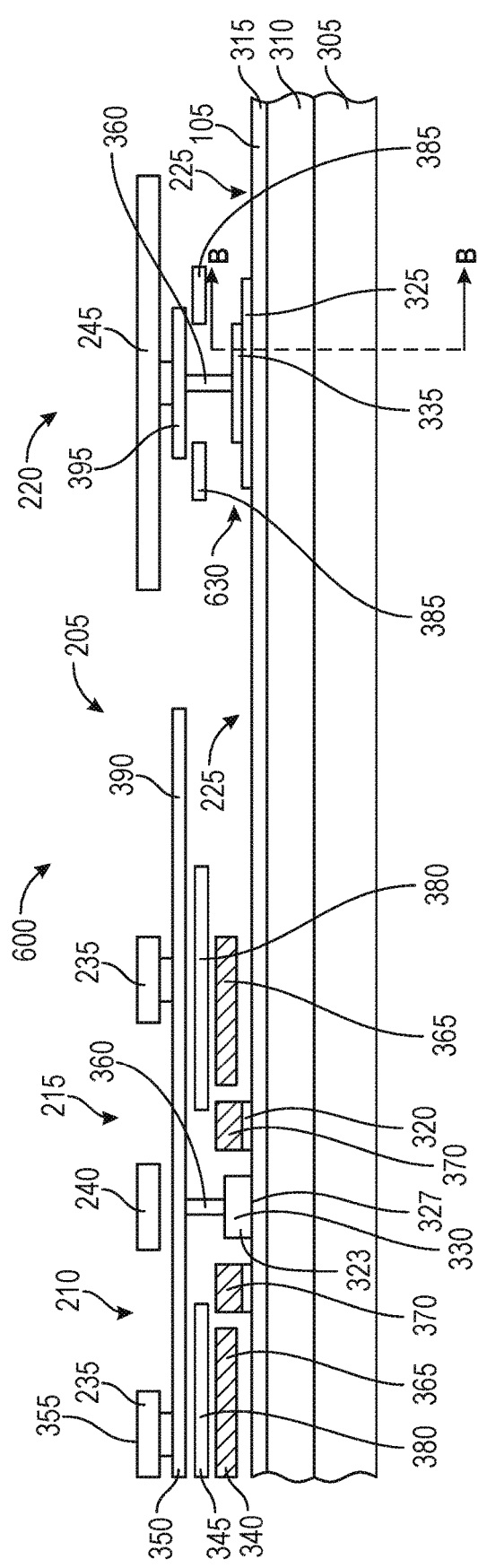
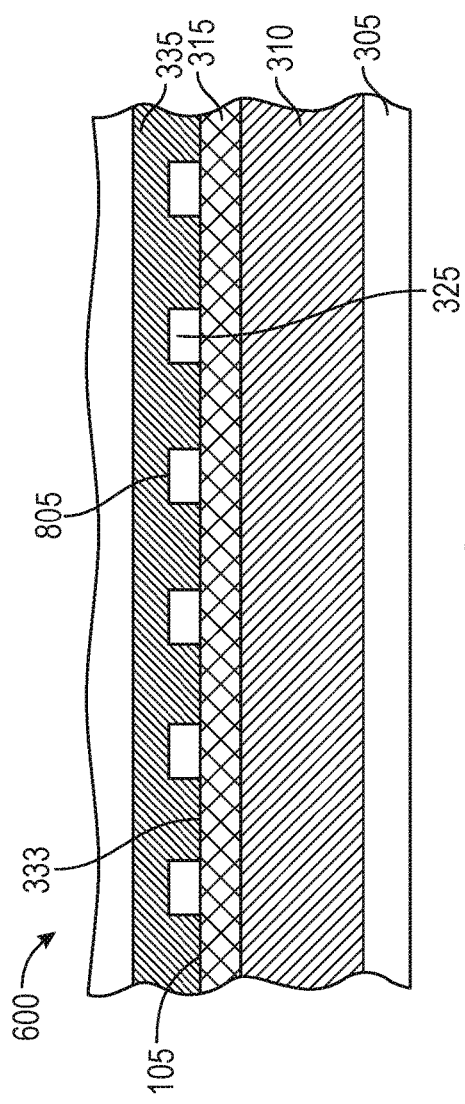
FIG. 7
FIG. 8

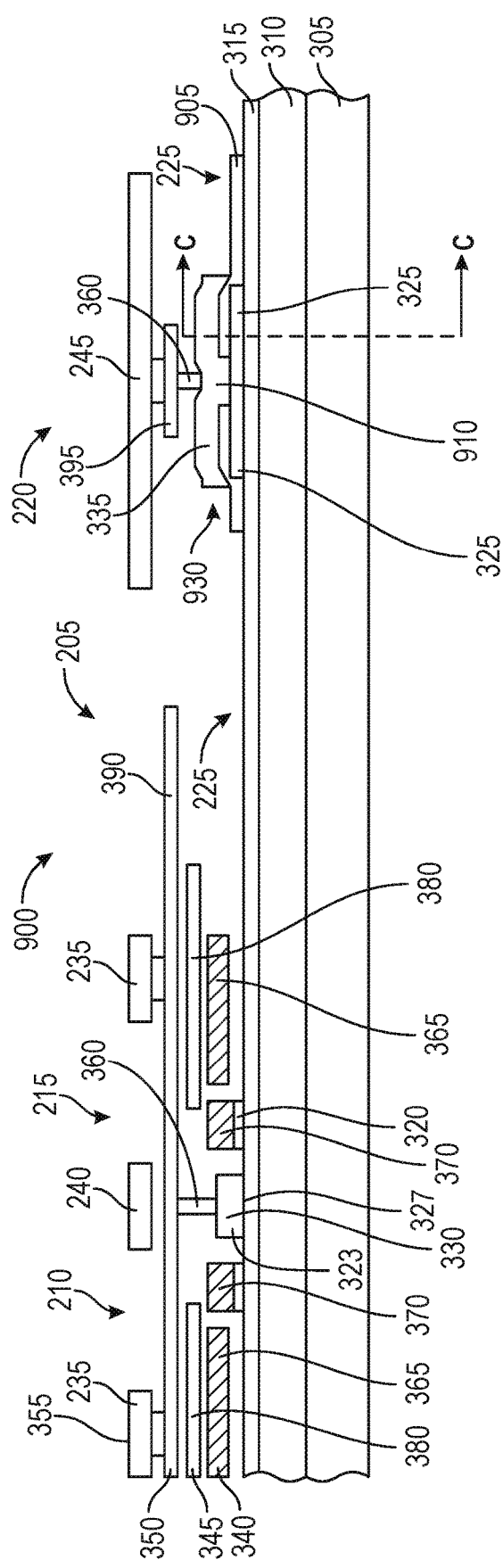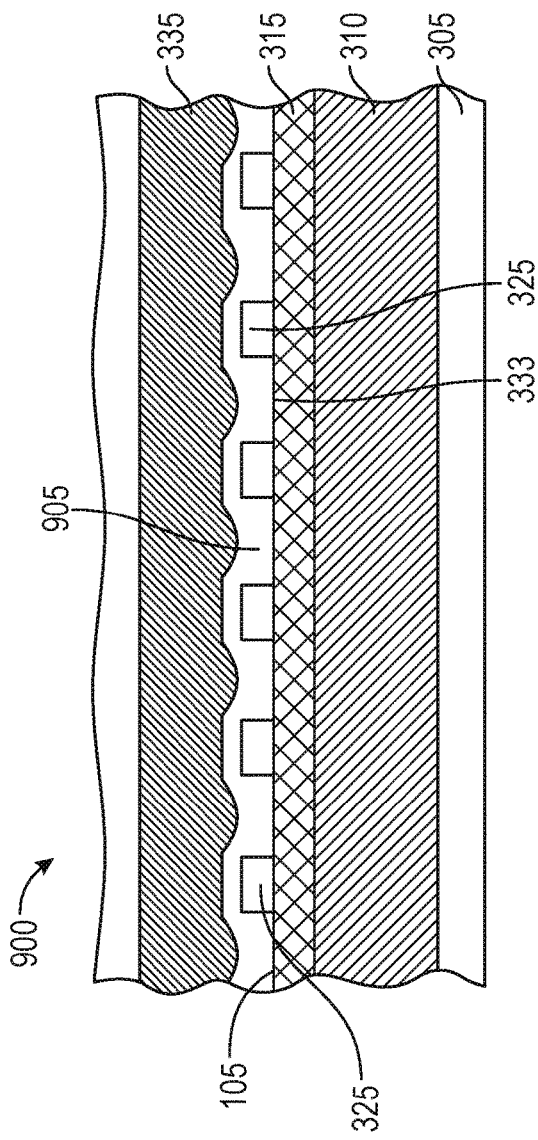
FIG. 9
FIG. 10

GALLIUM NITRIDE TRANSISTOR WITH IMPROVED TERMINATION STRUCTURE

CROSS-REFERENCES TO RELATED APPLICATIONS

This application claims priority to U.S. provisional patent application Ser. No. 62/661,585, for "GALLIUM NITRIDE TRANSISTOR WITH IMPROVED TERMINATION" filed on Apr. 23, 2018 which is hereby incorporated by reference in entirety for all purposes. This application is related to concurrently filed and commonly assigned U.S. Non-Provisional patent application for "GALLIUM NITRIDE TRANSISTOR STRUCTURE" US-1134206 filed on Apr. 23, 2019, U.S. Non-Provisional patent application Ser. No. 16/391,670, which is hereby incorporated by reference in its entirety for all purposes.

FIELD

The present invention relates generally to semiconductor devices and in particular to Gallium Nitride (GaN) based devices.

BACKGROUND

In semiconductor technology, GaN is used to form various integrated circuit devices, such as high power field-effect transistors, metal insulator semiconductor field effect transistors (MISFETs), high frequency transistors, high power Schottky rectifiers, and high electron mobility transistors (HEMTs). These devices can be formed by growing epitaxial layers, which can be grown on silicon, silicon carbide, sapphire, gallium nitride, or other substrates. Often, devices are formed using a heteroepitaxial junction of AlGaN and GaN. This structure is known to form a high electron mobility two-dimensional electron gas (2DEG) at the junction. Sometimes additional layers are added to improve or modify the charge density and mobility of electrons in the 2DEG. In some applications it may be desirable to have improved termination structures that improve the reliability and/or performance of GaN devices.

SUMMARY

Some embodiments of the present disclosure relate to gallium-nitride (GaN) based transistors that include one or more hole injection structures to mitigate the effects of trapped carriers that result in current collapse. A GaN transistor includes source, gate and drain connections to the substrate. A channel is formed between the source and the drain and current flow through the channel allowed or blocked depending on a voltage potential applied between the source and the gate. One or more P-type structures are formed on the substrate and positioned in the channel. The P-type structures are configured to inject holes in the channel to combine with and neutralize trapped carriers. The neutralization of the trapped carriers enables the channel to be more conductive and less susceptible to previous voltage potentials applied to the transistor.

In some embodiments a transistor comprises a semiconductor substrate and a source region formed in the substrate and including a source electrode in contact with a portion of the substrate. A drain region is formed in the substrate and is separated from the source region. A gate region is formed in the substrate and includes a gate stack in contact with a portion of the substrate, wherein the gate region is positioned between the source region and the drain region. A hole injection region is formed in the substrate and includes a P-type layer in contact with a portion of the substrate, wherein the hole injection region is positioned between the gate region and the drain region. A dielectric layer is formed over and in contact with a first portion of the P-type layer. A continuous metal layer is (1) formed over and in contact with the drain region of the substrate to form a drain electrode, (2) formed over and in contact with a second portion of the P-type layer to form a hole injection electrode, and (3) formed over and in contact with a portion of the dielectric layer to form a field plate for the hole injection region.

In some embodiments the continuous metal layer extends across the drain region of the substrate, abuts a first side surface of the P-type layer and extends across a first region of a top surface of the P-type layer. In various embodiments the dielectric layer extends across a surface of the substrate, abuts a second side surface of the P-type layer and extends across a second region of the top surface of the P-type layer. In some embodiments the field plate extends across the dielectric layer and terminates before becoming coplanar with the second side surface of the P-type layer.

In some embodiments the continuous metal layer is in ohmic contact with the P-type layer. In various embodiments the transistor further comprises a plurality of individual hole injection regions formed along a length of the drain region. In various embodiments the hole injection region is a first hole injection region and a second hole injection region is formed in the substrate and positioned between the first hole injection region and the gate region.

In some embodiments the second hole injection region includes a P-type layer that is in contact with a portion of the substrate and is not in ohmic contact with the continuous metal layer. In various embodiments the continuous metal layer is formed over approximately one half of a top surface of the P-type layer and the dielectric layer is formed over a remaining portion of the top surface of the P-type layer. In some embodiments the semiconductor substrate comprises gallium nitride.

In some embodiments a transistor comprises a semiconductor substrate and a source region formed in the substrate and including a source electrode in contact with a portion of the substrate. A drain region is formed in the substrate and is separated from the source region. A gate region is formed in the substrate and includes a gate stack in contact with a portion of the substrate, wherein the gate region is positioned between the source region and the drain region. A hole injection region is formed in the substrate and includes a P-type layer in contact with a portion of the substrate, wherein the hole injection region is positioned between the gate region and the drain region. A dielectric layer extends across a first region of a top surface of the P-type layer. A metal layer (1) extends across a drain region of the substrate to form a drain electrode, (2) extends across a second region of the top surface of the P-type layer to form a hole injection electrode, and (3) extends across a portion of the dielectric layer to form a field plate.

In some embodiments the field plate is a hole injection region field plate. In various embodiments the metal layer extends across the drain region of the substrate, abuts a first side surface of the P-type layer and extends across the second region of the top surface of the P-type layer to form the hole injection electrode. In some embodiments the dielectric layer extends across a surface of the substrate, abuts a second side surface of the P-type layer and extends across the first region of the top surface of the P-type layer.

In various embodiments the field plate extends across the first region of the dielectric layer and terminates before becoming coplanar with the second side surface of the P-type layer.

In some embodiments the metal layer is in ohmic contact with the P-type layer. In various embodiments the transistor further comprises a plurality of individual hole injection regions formed along a length of the drain region. In some embodiments the hole injection region is a first hole injection region and a second hole injection region is formed in the substrate and is positioned between the first hole injection region and the gate region. In various embodiments the second hole injection region includes a P-type layer that is in contact with a portion of the substrate and is not in ohmic contact with the continuous metal layer.

In some embodiments a transistor comprises a semiconductor substrate and a source region formed in the substrate and including a source electrode in contact with a portion of the substrate. A drain region is formed in the substrate and is separated from the source region. A gate region is formed in the substrate and includes a gate stack in contact with a portion of the substrate, wherein the gate region is positioned between the source region and the drain region. A floating hole injection region is formed in the substrate and includes a P-type layer in contact with a portion of the substrate, wherein the hole injection region is positioned between the gate region and the drain region.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 7 illustrates a partial cross-sectional view across the transistor shown in FIG. 6;

FIG. 8 illustrates a cross-section B-B of the transistor shown in FIG. 7;

FIG. 9 illustrates a partial cross-sectional view of a GaN-based transistor according to an embodiment of the disclosure;

FIG. 10 illustrates a partial cross-sectional view C-C across the transistor shown in FIG. 9;

DETAILED DESCRIPTION

Certain embodiments of the present invention relate to GaN-based enhancement-mode field effect transistors having hole injection structures that inject holes in the channel to mitigate "current collapse" in the transistor. Current collapse is an undesirable "memory" effect where the conduction current of the device can be dependent on previously applied voltages, and also on how long these previously applied voltages were present. More specifically, during transistor operation, electrons can get trapped (known as trapped carriers) in epitaxial and/or dielectric layers and repel other electrons flowing through the transistor channel, making it more difficult to conduct current through the 2DEG layer, resulting in an increase in resistance through the channel. In some embodiments the addition of one or more hole injection structures are used to inject holes in the channel so the holes combine with and neutralize the trapped electrons. The reduction of trapped electrons results in a lower electrical resistance in the channel, mitigating the memory effect.

Some embodiments of the present disclosure relate to GaN-based transistors having P-type hole injection structures formed adjacent the drain contact. Hole injection electrodes can be formed on the P-type hole injection structures so the hole injection electrodes are electrically coupled to the drain ohmic metal. In other embodiments the P-type hole injection structures can be electrically insulated from the drain ohmic metal and can be capacitively coupled to the drain ohmic metal.

In order to better appreciate the features and aspects of GaN-based transistors having P-type hole injection structures according to the present disclosure, further context for the disclosure is provided in the following section by discussing several particular implementations of semiconductor devices according to embodiments of the present disclosure. These embodiments are for example only and other embodiments can be employed in other semiconductor devices such as, but not limited to gallium-arsenide, indium-phosphide and other types of semiconductor materials.

Figure 1:
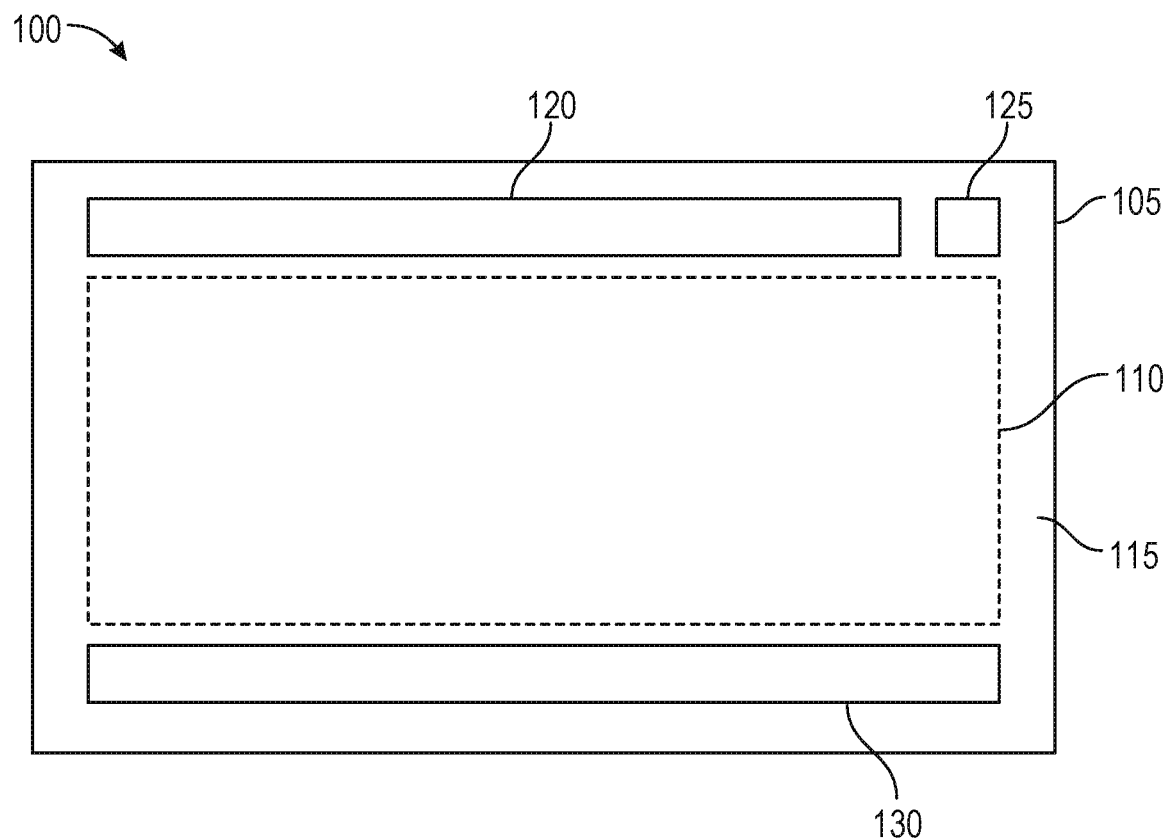
FIG. 1 illustrates a simplified plan view of a GaN-based semiconductor transistor 100 according to an embodiment of the disclosure.

FIG. 1 illustrates a simplified plan view of a GaN-based semiconductor transistor 100. As shown in FIG. 1, transistor 100 is constructed on a substrate 105. Transistor 100 can have an active region 110 surrounded by an inactive region 115 that includes a source terminal 120, a gate terminal 125 and a drain terminal 130 that are used to form electrical connections to the transistor. Active region 110 can have one or more transistor "cells" that are repeated across the active region, as discussed in greater detail herein. Transistor 100 is an illustrative example of a GaN transistor having hole injectors in accordance with embodiments of this disclosure, however, a person of skill in the art will appreciate that in other embodiments, GaN transistor 100 can have a size, shape and configuration different than the specific examples set forth herein and this disclosure is in no way limited to the examples set forth herein.

Figure 2:
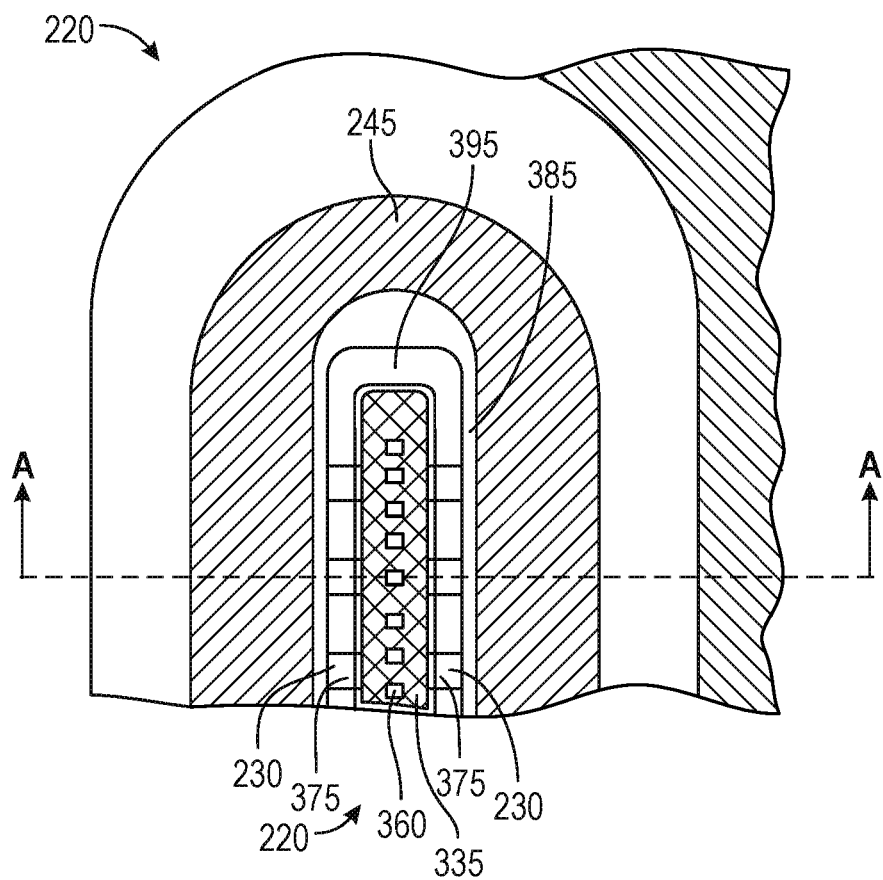
FIG. 2 illustrates a magnified partial plan view of the active region of the GaN-based semiconductor transistor shown in FIG. 1.
Figure 3:
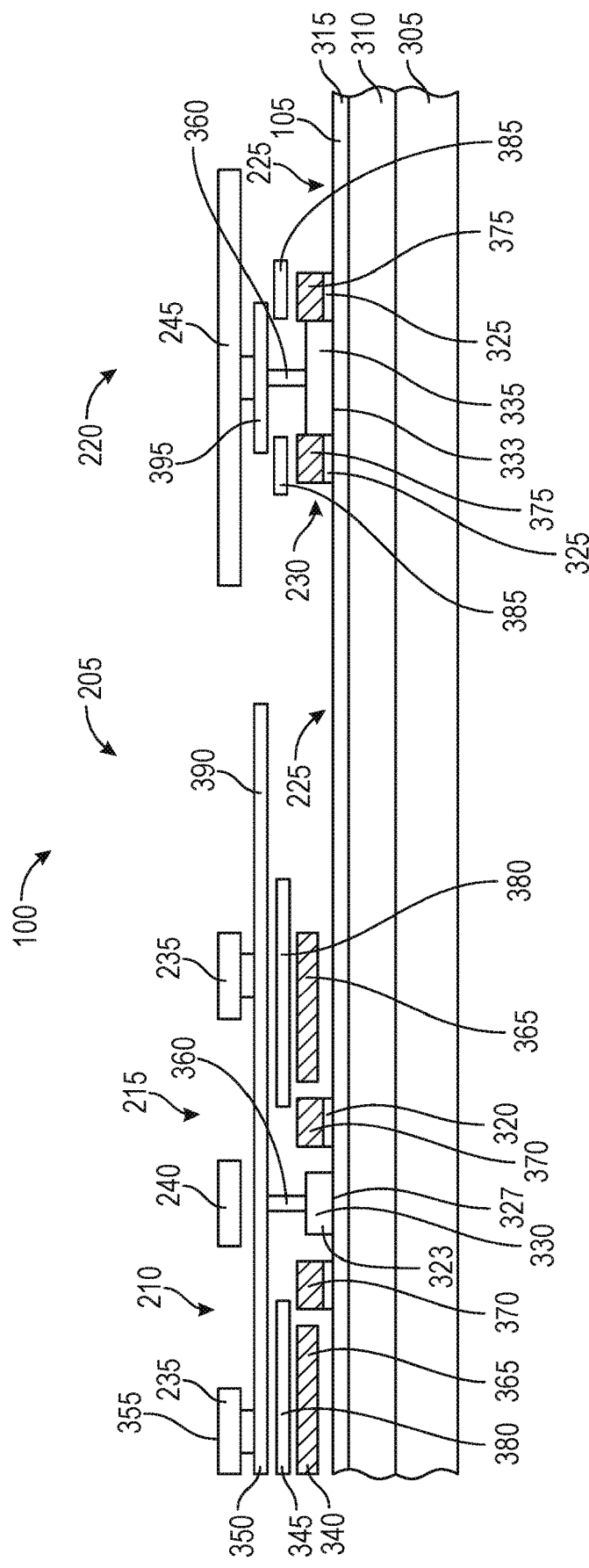
FIG. 3 illustrates a partial cross-sectional view across line A-A on the transistor cell illustrated in FIG. 2.

FIG. 2 illustrates a magnified partial plan view of a drain region 220 of a GaN-based transistor that may form a portion of active region 110 of transistor 100 in FIG. 1. FIG. 3 illustrates a partial cross-sectional view across line A-A of drain region 220 of FIG. 2 and also shows a cross-sectional view of source region 210 and gate region 215 of transistor cell 205. The following description will simultaneously refer to FIGS. 2 and 3.

In some embodiments a drift region 225 is disposed between source region 210 and drain region 220 in order to withstand high voltage. A channel region is formed in the 2DEG under the gate stack 320 and is configured to block or conduct current depending on an applied voltage between gate terminal 125 (see FIG. 1) and source terminal 120. One or more hole injectors 230 are disposed adjacent drift region 225 and are configured to inject holes into the channel to combine with trapped electrons, as described in more detail below.

As illustrated in FIG. 3, in some embodiments substrate 105 can include a first layer 305 that can include silicon carbide, sapphire, aluminum nitride or other material. A second layer 310 is disposed on first layer 305 and can include gallium nitride or other material. A third layer 315 is disposed on second layer 310 and can include a composite stack of other III nitrides such as, but not limited to, aluminum nitride, indium nitride and III nitride alloys such as aluminum gallium nitride and indium gallium nitride. In one embodiment third layer 315 is $Al_{0.20}Ga_{0.80}N$.

In some embodiments, a two-dimensional electron gas (2DEG) inducing layer is formed within substrate 105 and can be positioned proximate an interface between second layer 310 and third layer 315. In some embodiments, the 2DEG layer is induced by a combination of piezoelectric effect (stress), bandgap differential, and/or polarization charge. For example, there may be a reduction in the conduction band at the surface, where it drops below the fermi level to create a potential well which fills with electrons. In some embodiments, the 2DEG inducing layer comprises AlGaN in a range, for example, of $Al_{0.25}Ga_{0.75}N$ about 20 nanometers thick. In alternative embodiments, the 2DEG inducing layer can comprise AlN, AlGaInN, or another material. In some embodiments, the 2DEG inducing layer comprises a thin boundary layer with high Al content and a thicker layer with less Al content. In some embodiments the 2DEG inducing layer can have a GaN cap layer while in other embodiments the 2DEG inducing layer does not have a GaN cap layer.

In some embodiments one or more gate stacks 320 are formed on substrate 105 to form gate structures. For example, gate stack 320 can include several layers of compound semiconductors that each can include nitrogen and one or more elements from column three of the periodic table, such as aluminum or gallium or indium or others (e.g., 3N layers). These layers can be doped or undoped. If they are doped they can be doped with either N-type or P-type dopants. In some embodiments, gate stack 320 can be an insulated gate, Schottky gate, PN gate, recessed gate, or other type of gate.

In some embodiments one or more hole injectors 230 are formed on substrate 105. Hole injectors 230 can be formed with a P-type structure 325 disposed on substrate 105. In some embodiments P-type structure 325 can be formed using gallium nitride that is doped with a P-type dopant, that can be as a non-limiting example, magnesium. P-type structure 325 can act as a hole injector during operation of the semiconductor device to improve performance and/or reliability of transistor 100, as described in more detail herein.

An ohmic metal layer 323 can be deposited and patterned to form ohmic contacts to substrate 105 including a source ohmic contact 327 formed between source ohmic pad 330 and substrate 105, and a drain ohmic contact 333 formed between drain ohmic pad 335 and substrate 105, and other regions as necessary. In some embodiments ohmic metal layer 323 can include aluminum, titanium, nickel, gold or other metal. After ohmic metal layer 323 is deposited and patterned, the ohmic metal layer can be annealed to form low resistance electrical connections between the remaining ohmic metal and the 2DEG inducing layer that can be exposed in the ohmic contact regions (e.g., the source and the drain).

Additional sequentially deposited metal layers can include MG layer (gate metal layer) 340, M0 layer 345, M1 layer 350, M2 layer 355 and so on can be patterned using commercially available processes. To electrically insulate metal layers 340, 345, 350 and 355 from one another and/or from substrate 105, one or more intervening dielectric layers can used. In some embodiments dielectric layers can include, but are not limited to, silicon nitride (e.g., Si3N4, Si2N, or SN) or Silicon oxide (e.g. SiO2 or similar) which can be deposited and patterned. In some embodiments, the intervening dielectric layers each comprise only a single layer of insulator material while in other embodiments each layer can comprise a plurality of layers. The insulator layers can be planarized, using, for example, chemo-mechanical polishing, or other techniques.

In some embodiments, MG layer 340 can be used to form a MG source field plate 365, gate electrode 370, and hole injection electrode 375. In various embodiments, hole injection electrode 375 can be positioned immediately adjacent to and in electrical contact with drain ohmic pad 335 so hole injector 230 has substantially a same voltage as drain ohmic pad 335.

In some embodiments, M0 layer 345 can be used to form M0 source field plate 380 and M0 drain field plate 385. In various embodiments, M1 layer 350 can be used to form M1 source field plate 390 and M1 intermediate drain plate 395. In some embodiments, M2 layer 355 can be used to form source bus 235, gate bus 240 and drain bus 245. Source bus 235 electrically couples source ohmic pad 330 of each transistor cell 205 to source terminal 120 (see FIG. 1). Gate bus 240 electrically couples gate electrode 370 of each transistor cell 205 to gate terminal 125 (see FIG. 1). Drain bus 245 electrically couples drain ohmic pad 335 of each transistor cell 205 to drain terminal 130 (see FIG. 1).

In some embodiments, one or more vias 360 can be formed through one or more of the intervening insulator layers to electrically connect one or more metal layers 340, 345, 350 and 355 to one another.

In some embodiments transistor 100 reacts to an applied electrical field under gate stack 320 to control an electrical conductivity of the 2DEG channel underneath. The electrical conductivity of the channel is a function of a voltage potential applied between gate terminal 125 (see FIG. 1) and source terminal 120. Gate terminal 125 can be thought of as controlling the opening and closing of a physical gate. The voltage applied to gate terminal 125 permits electrons and/or holes to flow between the source terminal 120 and drain terminal 130, or blocks their passage, by creating or eliminating the 2DEG channel under the gate. The electrical conductivity of the channel is influenced by the magnitude of the applied voltage potential between gate terminal 125 (see FIG. 1) and source terminal 120.

In some embodiments, during operation of transistor 100, electrons can get trapped in the epitaxial or dielectric layers (commonly referred to as "trapped carriers") within substrate 105 and repel electrons flowing through drift region 225, increasing the resistance to current to flowing between source terminal 120 and drain terminal 130. This phenomenon can result in an increase in electrical resistance in drift region 225 (e.g., an increase in $R_{DS}ON$) and is commonly referred to as "dynamic Rdson" or "current collapse". Dynamic Rdson is an undesirable "memory" effect where the conduction current of the device can be dependent on previously applied voltages between source terminal 120 and drain terminal 130, and also on how long these previously applied voltages were present.

More specifically, the electrical resistance of drift region 225 can increase for a certain period of time when the transistor is turned on again after being turned off. To prevent dynamic Rdson increase, in the embodiment illustrated in FIGS. 1 and 2, a plurality of hole injector 230 islands of P-type GaN are placed immediately adjacent drain ohmic pad 335 and are electrically coupled to the drain ohmic metal with hole injection electrodes 375 formed in MG layer 340. Each hole injector 230 inject holes in the drift region 225 near the drain region 220. The holes combine with trapped electrons to neutralize them, preventing, or at least mitigating current collapse.

In one embodiment each hole injector 230 island can be between 0.5 and 5 microns square, while in other embodiments each island can be between 0.75 and 2 microns square and in one embodiment each island is between 0.9 and 1.1 microns square, however one of skill in the art will appreciate that the invention is not limited to square geometries or the aforementioned dimensions and hole injectors having other geometries and/or dimensions can be used.

As discussed above with regard to FIG. 1, transistor 100 can be arranged in repeating cells, an example of which is illustrated in FIGS. 2 and 3. Each cell can include a source, a gate, a drain and one or more hole injection structures. An adjacent cell can use the same drain and may have its own gate and source terminations. Similarly, an adjacent cell can use the same source and have its own drain termination. In some embodiments a transistor structure includes a plurality of interdigitated source and drain fingers, with a gate structure disposed between each source and drain finger. Therefore, as shown in FIG. 3, a drift region 225 can be formed on either side of drain region 220.

Figure 4:
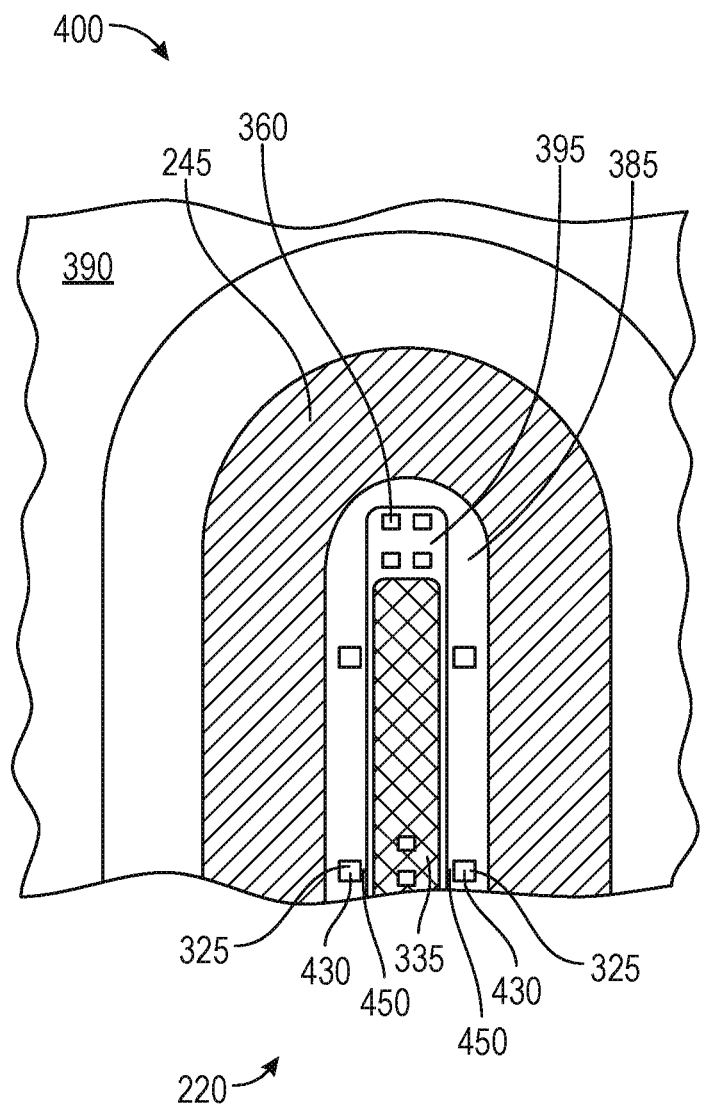
FIG. 4 illustrates a simplified plan view of a drain region of a GaN-based transistor according to an embodiment of the disclosure.
Figure 5:
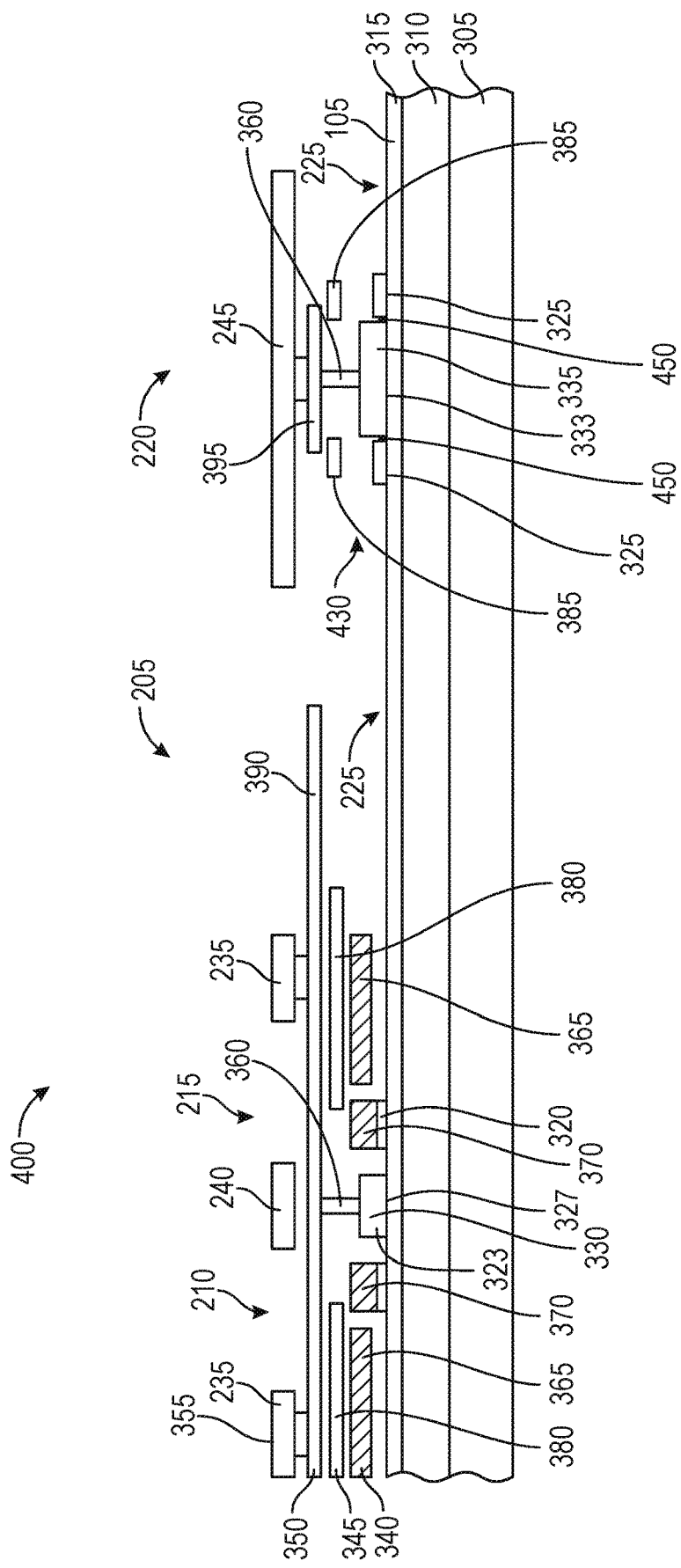
FIG. 5 illustrates a partial cross-sectional view across the transistor shown in FIG. 4.

FIG. 4 illustrates a simplified plan view of drain region 220 of a GaN-based transistor 400 according to another embodiment of the disclosure. Transistor 400 is constructed similar to transistor 100 illustrated in FIGS. 1-3 (with like numbers referring to like elements), however transistor 400 has a plurality of capacitively coupled hole injectors, as described in more detail below. FIG. 5 illustrates a partial cross-sectional view across transistor 400, with the cross-section made in a similar region of the transistor as the cross-section illustrated in FIG. 3 (with like numbers referring to like elements). The following description will simultaneously refer to FIGS. 4 and 5.

Similar to the embodiment illustrated in FIGS. 1-3, transistor 400 includes one or more hole injectors 430 formed on substrate 105. Hole injectors 430 can be formed with a P-type structure 325 disposed on substrate 105. In some embodiments P-type structure 325 can be formed using a combination of aluminum gallium nitride or gallium nitride which are doped with a p-type dopant such as magnesium. P-type structure 325 can act as a hole injector during operation of the semiconductor device to improve performance and/or reliability of transistor 400, as described in more detail herein.

In comparison with transistor 100 in FIGS. 1-3, transistor 400 in FIGS. 4 and 5 includes hole injectors 430, but does not have hole injection electrodes 375 (see FIG. 3) and hole injectors 430 are spaced away from drain ohmic pad 335 such that hole injectors 430 are electrically insulated from the drain ohmic pad 335. More specifically, hole injectors 430 of transistor 400 only include P-type structures 325 and do not include hole injector electrodes (e.g., there is no metal on top of P-type structure 325). Further, hole injectors 430 of transistor 400 include a gap 450 positioned between P-type structures 325 and drain ohmic pad 335, where the gap is filled with a dielectric material resulting in electrically floating hole injectors. As used herein, the term "floating hole injectors" shall mean that the hole injection structures (e.g., P-type GaN regions) are not ohmically coupled to source, gate or drain electrodes but instead use capacitive coupling or a combination of capacitive coupling and leakage current to enable the floating hole injectors to inject holes in drift region 225.

Figure 6:
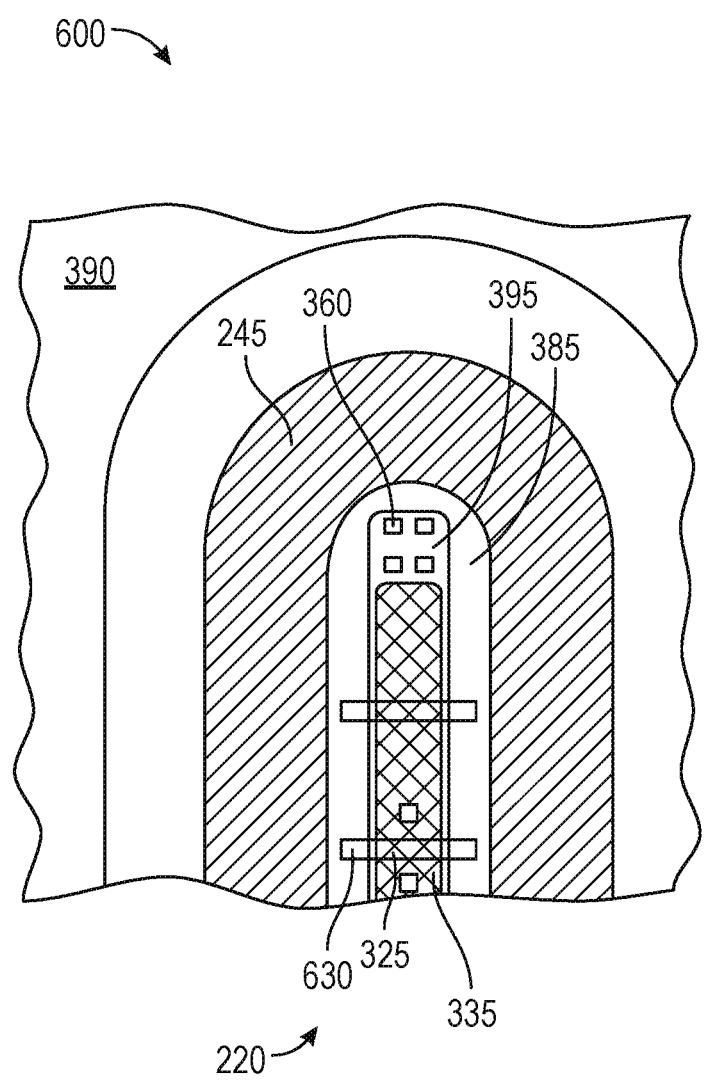
FIG. 6 illustrates a simplified plan view of a drain region of a GaN-based transistor according to an embodiment of the disclosure.

FIG. 6 illustrates a simplified plan view of drain region 220 of a GaN-based transistor 600 according to another embodiment of the disclosure. Transistor 600 is constructed similar to transistor 100 illustrated in FIGS. 1-3 (with like numbers referring to like elements), however transistor 600 has a plurality of hole injectors 630 in the shape of stripes and the drain ohmic metal functions as both a drain ohmic electrode and a hole injector electrode, as described in more detail below. FIG. 7 illustrates a partial cross-sectional view across transistor 600, with the cross-section made in a similar region of the transistor as the cross-section illustrated in FIG. 3 (with like numbers referring to like elements). The following description will simultaneously refer to FIGS. 6 and 7.

Similar to the embodiment illustrated in FIGS. 1-3, transistor 600 includes one or more hole injectors 630 formed on substrate 105. Hole injectors 630 can be formed with a P-type structure 325 disposed on substrate 105, however instead of being square islands positioned on either side of drain contact 333, the P-type structures are arranged in repetitive stripes that extend across the drain contact and into drift regions 225 formed on either side of the drain contact.

In comparison with transistor 100 in FIGS. 1-3, transistor 600 in FIGS. 6 and 7 includes hole injectors 630, but does not have separately formed hole injection electrodes 375 as shown in FIG. 3. More specifically, drain ohmic pad 335 forms both the drain ohmic contact 333 and a hole injection electrode. This is illustrated more clearly in FIG. 8 which is cross-section B-B of transistor 600 illustrated in FIG. 7. As shown in FIG. 8, repetitive P-type structures 325 are formed on substrate 105. Drain ohmic pad 335 contacts both drain contact 333 as well as P-type structure contact 805. Therefore drain ohmic pad 335 electrically couples P-type structures 325 to drain contact 333.

FIG. 9 illustrates a partial cross-sectional view of a GaN-based transistor 900 according to another embodiment of the disclosure. Transistor 900 is constructed similar to transistor 600 illustrated in FIGS. 6-8 (with like numbers referring to like elements), however transistor 900 has a dielectric layer 905 formed over P-type structures 325 that are in the shape of stripes and drain ohmic pad 335 functions as both a drain ohmic electrode and a hole injector electrode, as described in more detail below. FIG. 10 illustrates a partial cross-sectional view C-C across transistor 900 illustrated in FIG. 9. The following description will simultaneously refer to FIGS. 9 and 10.

Similar to the embodiment illustrated in FIGS. 6-8, transistor 900 includes one or more hole injectors 930 formed on substrate 105. Hole injectors 930 can be formed with a P-type structure 325 disposed on substrate 105. P-type structures 325 can be arranged in repetitive stripes that extend across drain contact 333 and into drift regions 225 formed on either side of the drain contact.

In comparison with transistor 600 in FIGS. 6-8, transistor 900 in FIGS. 9 and 10 includes a dielectric layer 905 formed over P-type structures 325 and portions of substrate 105. Openings 910 are formed in dielectric layer 905 and drain ohmic pad 335 is formed on top of the dielectric layer and within openings 910 to make electrical contact with P-type structures 325. In some embodiments openings 910 can extend across a spacing between P-type structures 325 exposing portions of substrate 105 so drain ohmic pad 335 can form a drain contact 333 between each P-type structure. Other embodiments may have a different configuration of openings formed in dielectric layer 905 so that drain ohmic pad 335 can form both a hole injector electrode and a drain electrode. Since drain ohmic pad 335 contacts both drain contact 333 as well as P-type structure 325 the drain ohmic metal layer electrically couples P-type structures 325 to drain contact 333.

Figure 11:
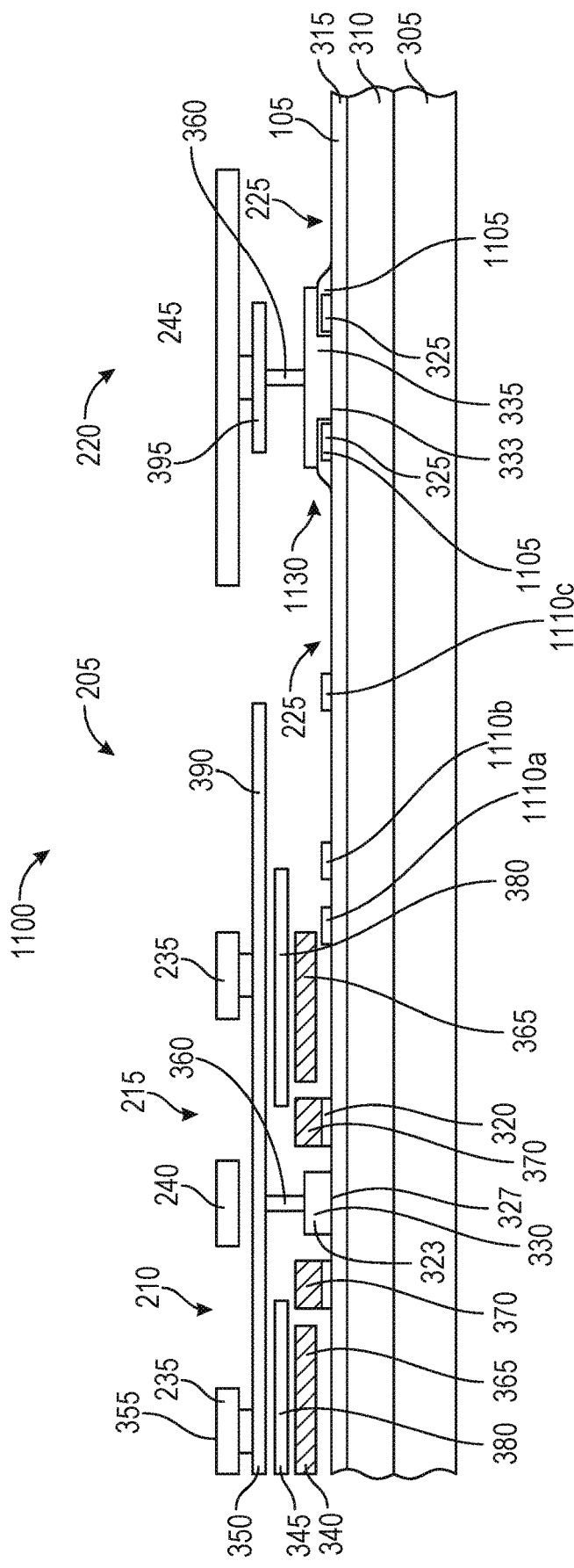
FIG. 11 illustrates a partial cross-sectional view of a GaN-based transistor according to an embodiment of the disclosure.

FIG. 11 illustrates a partial cross-sectional view of a GaN-based transistor 1100 according to another embodiment of the disclosure. Transistor 1100 is constructed similar to transistor 900 illustrated in FIGS. 9 and 10 (with like numbers referring to like elements), however transistor 1100 has two separate P-type structures 325 with a gap in-between for drain contact 333, as described in more detail below.

Similar to the embodiment illustrated in FIGS. 9 and 10, transistor 1100 includes one or more hole injectors 1130 formed on substrate 105. Hole injectors 1130 can be formed with a P-type structure 325 disposed on substrate 105. P-type structures 325 can be arranged in repetitive islands that are disposed on either side of drain contact 333. Transistor 1100 includes a dielectric layer 1105 that covers an entirety of each P-type structure 325 so it is electrically insulated from drain ohmic pad 335. Drain ohmic pad 335 extends between P-type structures 325 to contact substrate 105 forming drain contact 333. Drain ohmic pad 335 also extends over top of P-type structures 325, with dielectric layer 1105 positioned between the drain ohmic metal layer and the P-type structures. Thus, hole injectors 1130 are electrically insulated from drain ohmic pad 335 and the hole injectors use capacitive coupling to drain ohmic pad 335 to enable P-type structures 325 to inject holes in drift region 225.

Continuing to refer to FIG. 11, in some embodiments electrical fields at a drain-edge of source field plates 365, 380 and/or 390 can be higher than surrounding areas and as a result these regions can result in a higher concentration of trapped carriers in drift region 225. Therefore, in some embodiments positioning one or more floating P-type GaN structures 1110*a* . . . 1110*c* aligned with the drain-edge of source field plates 365, 380 and/or 390 can result in efficient and/or effective neutralization of trapped carriers in drift region 225.

Figure 13:
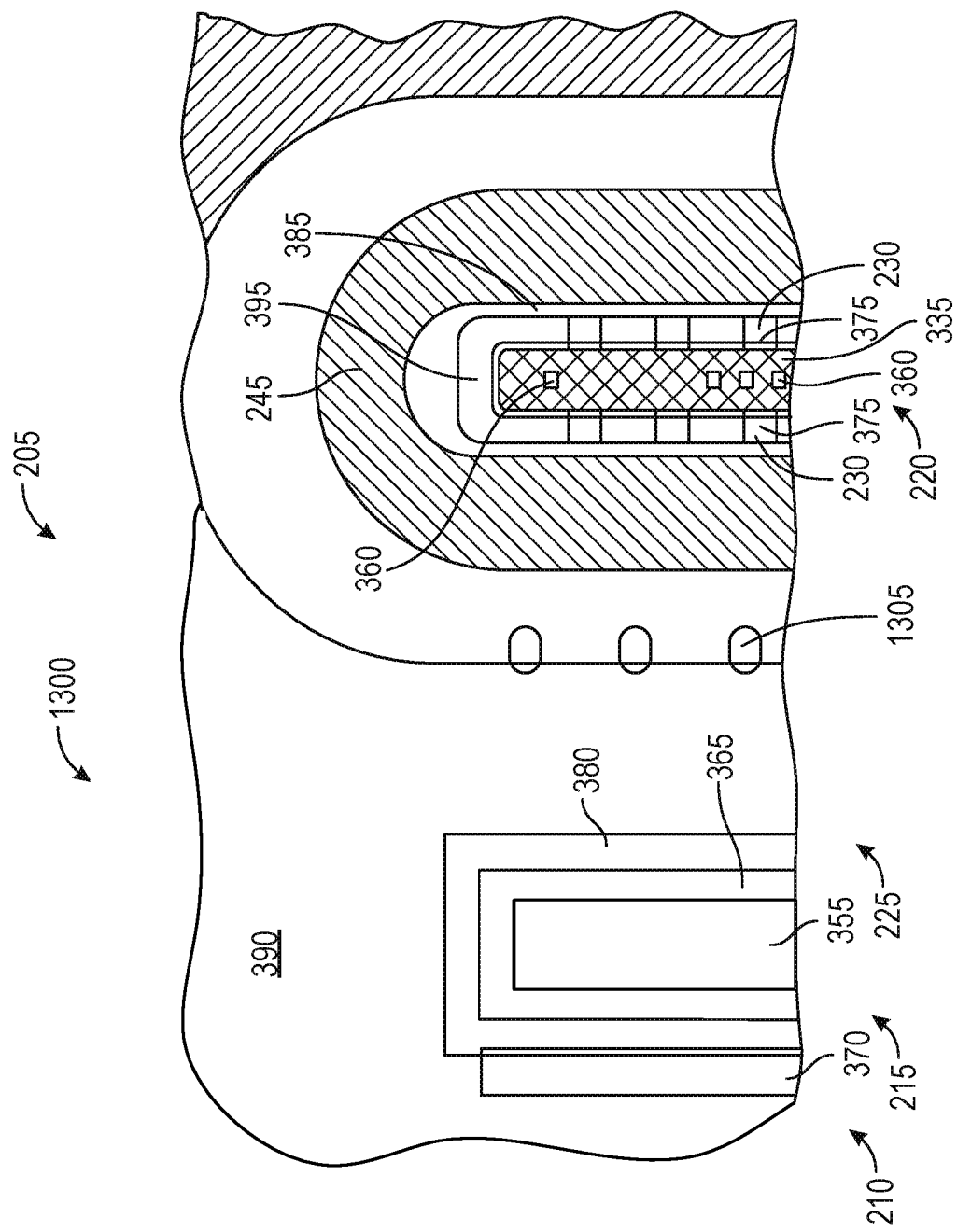
FIG. 13 illustrates a simplified plan view of a GaN-based transistor according to an embodiment of the disclosure.
Figure 14:
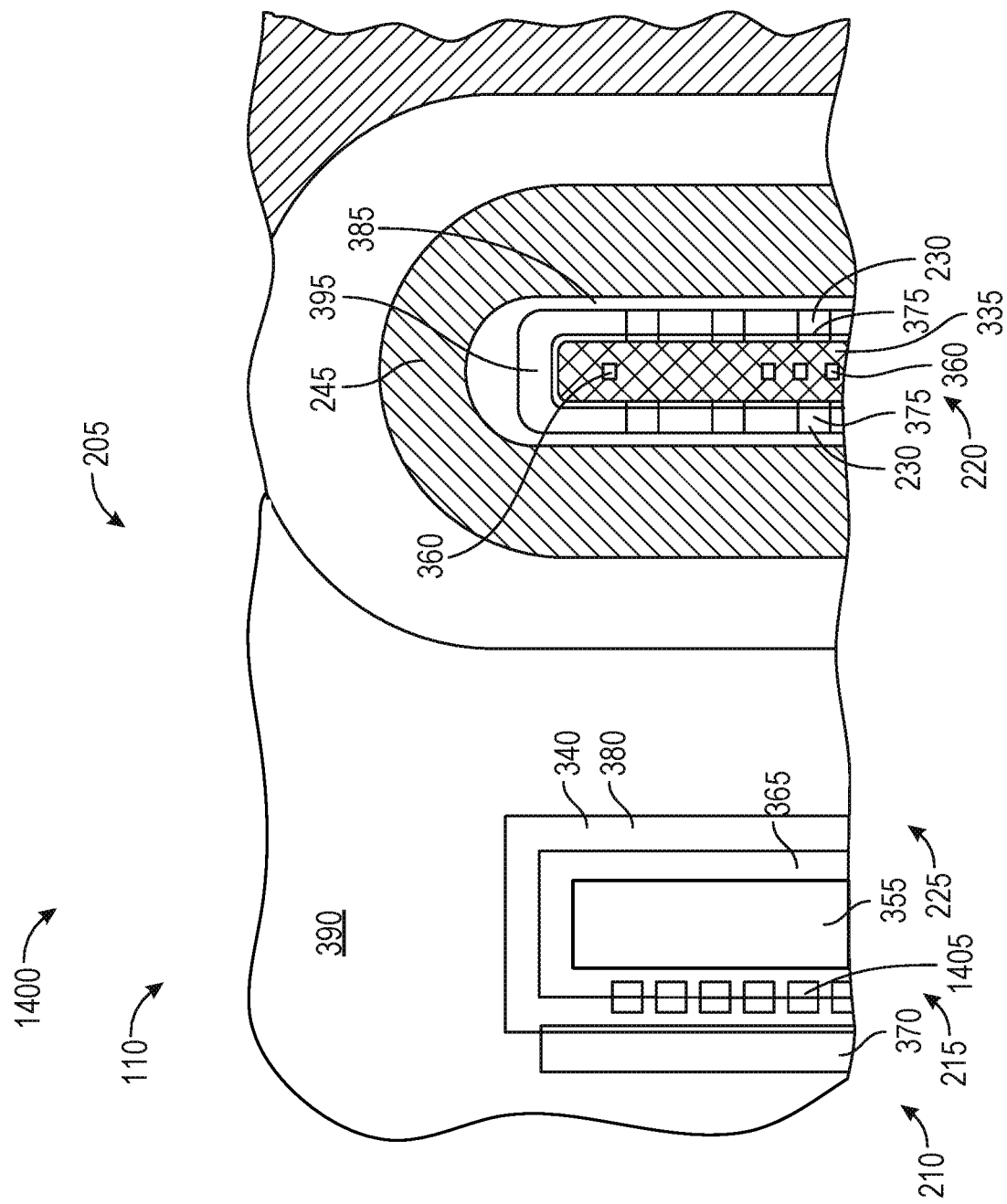
FIG. 14 illustrates a simplified plan view of a GaN-based transistor according to an embodiment of the disclosure.

More specifically, in some embodiments floating P-type GaN structures 1110*a* . . . 1110*c* are configured to inject holes in drift region 225 when in the presence of high electrical fields, as described in further detail herein and in FIGS. 13 and 14. In some embodiments floating P-type GaN structures 1110*a* . . . 1110*c* can be formed using gallium nitride that is doped with a P-type dopant that can be, for example, magnesium.

Figure 12:
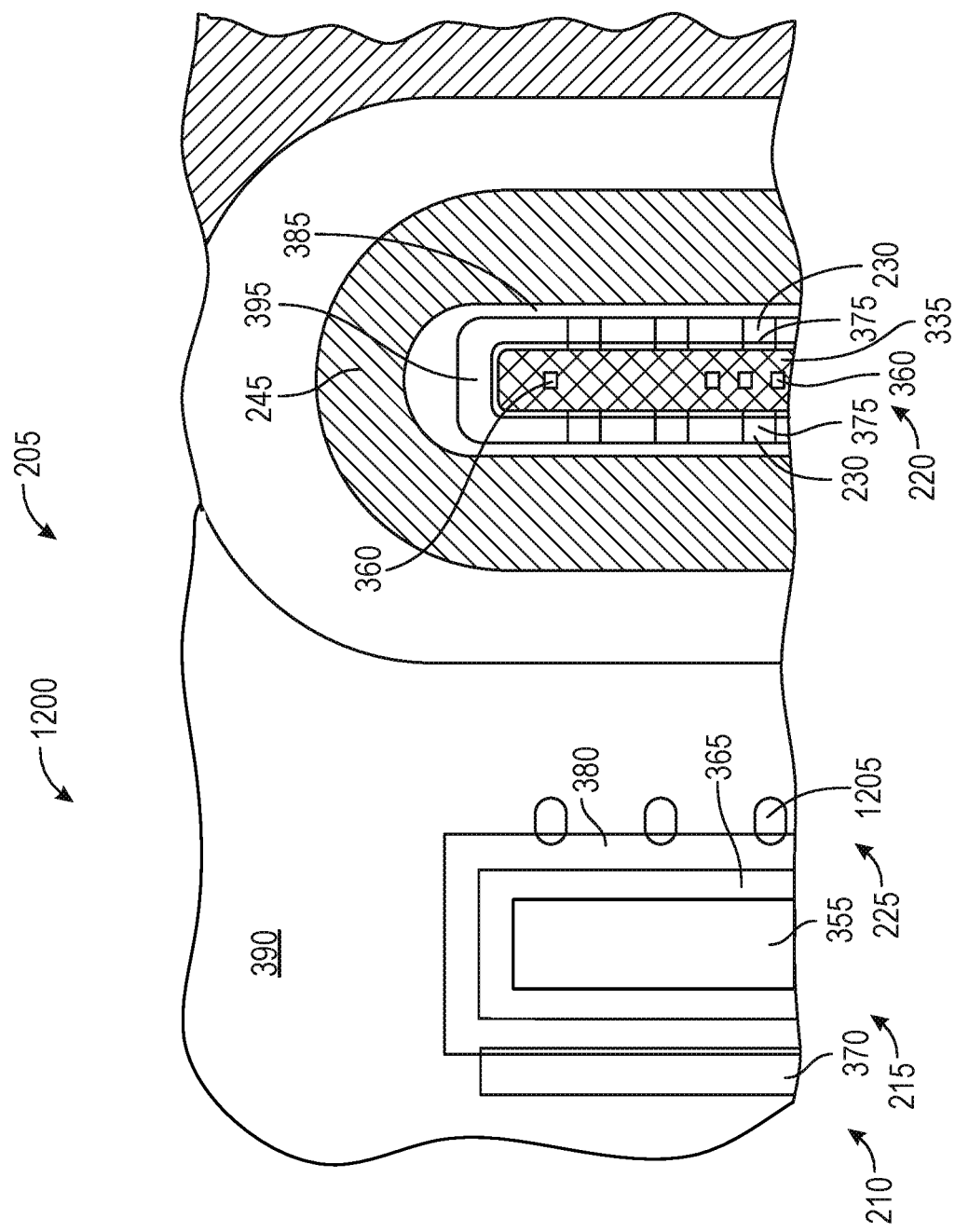
FIG. 12 illustrates a simplified plan view of a GaN-based transistor according to an embodiment of the disclosure.

FIG. 12 illustrates a simplified plan view of a GaN-based transistor 1200 according to another embodiment of the disclosure. Transistor 1200 is constructed similar to transistor 1100 illustrated in FIG. 11 (with like numbers referring to like elements), however instead of having a plurality of floating P-type GaN structures under each of three source field plates, 365, 380, 390, transistor 1200 has a plurality of floating P-type GaN structures 1205 positioned under and aligned with a drain-edge of only source field plate 380. More specifically, in the embodiment illustrated in FIG. 12, plurality of floating P-type GaN structures 1205 are positioned partially under M0 source field plate 380 and fully under M1 source field plate 390, in drift region 225. In other embodiments floating P-type GaN structures 1205 can be placed within drift region 225 in a different position than is shown in FIG. 12. In some embodiments, floating P-type GaN structures 1205 can perform the same function as P-type GaN structures 325 (see FIG. 11) described in more detail above. In some embodiments floating P-type GaN structures 1205 can be formed using gallium nitride that is doped with a P-type dopant, that can be, for example, magnesium.

FIG. 13 illustrates a simplified plan view of a GaN-based transistor 1300 according to another embodiment of the disclosure. Transistor 1300 is constructed similar to transistor 1100 illustrated in FIG. 11 (with like numbers referring to like elements), however instead of having a plurality of floating P-type GaN structures under each of three source field plates, 365, 380, 390, transistor 1300 has a plurality of floating P-type GaN structures 1305 positioned under and aligned with a drain-edge of only source field plate 390. More specifically, in the embodiment illustrated in FIG. 13, plurality of floating P-type GaN structures 1305 are positioned partially under M1 source field plate 390, in drift region 225. In other embodiments floating P-type GaN structures 1305 can be placed within drift region 225 in a different position than is shown in FIG. 13. In some embodiments, floating P-type GaN structures 1305 can perform the same function as P-type GaN structures 325 (see FIG. 11) described in more detail above. In some embodiments floating P-type GaN structures 1305 can be formed using gallium nitride that is doped with a P-type dopant, that can be, for example, magnesium.

FIG. 14 illustrates a simplified plan view of a GaN-based transistor 1400 according to another embodiment of the disclosure. Transistor 1400 is constructed similar to transistor 100 illustrated in FIGS. 1-3 (with like numbers referring to like elements), however transistor 1400 has a plurality of P-type GaN structures 1405 positioned next to gate electrode 370 within drift region 225, adjacent and under source field plates 365, 380 and 390. In the embodiment illustrated in FIG. 14, P-type GaN structures 1405 are centered on a first edge of MG source field plate 365 that is closest to gate electrode 370, however in other embodiments they can be located at any position adjacent gate electrode 370.

In some embodiments, P-type GaN structures 1405 can assume a potential close to the gate electrode by capacitive coupling or leakage. Trapping of electrons can be caused by high electric fields accelerating hot electrons into dielectrics or substrate regions. The P-type GaN structures 1405 can prevent the high voltage and high electric field in the drift region from reaching the gate region and reduce the amount of trapping that occurs in that region. This reduced carrier injection can reduce the Dynamic Rdson effect and improve the life of the product. Although transistor 1400 is similar to transistor 100 illustrated in FIGS. 1-3, it will be appreciated by one of skill in the art that transistor 1400 can have a different structure, including that of transistors 400, 600, 900 or 1100 shown in the previous figures, or any other configuration.

Figure 15:
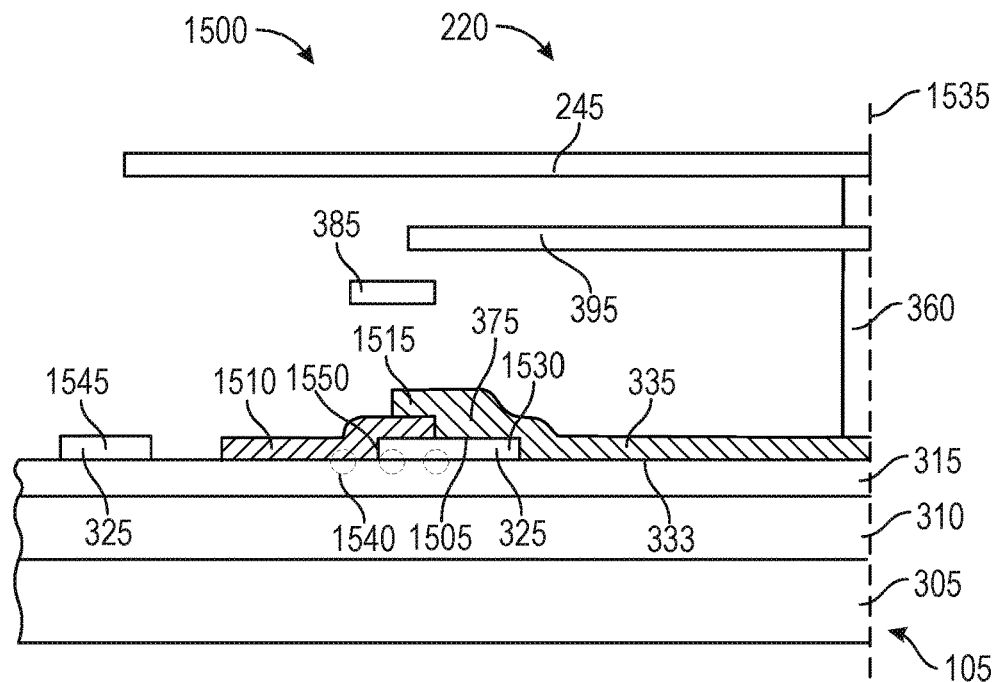
FIG. 15 illustrates a partial cross-sectional view of a GaN-based transistor according to an embodiment of the disclosure.

FIG. 15 illustrates a partial cross-sectional view of a GaN-based transistor 1500 according to another embodiment of the disclosure. Transistor 1500 is constructed similar to transistor 1100 illustrated in FIG. 11 (with like numbers referring to like elements) including a P-type structure ohmically coupled to the drain terminal, however transistor 1500 has a dielectric layer 1510 that only covers a portion of the P-type structure 325 and drain ohmic pad 335 is in ohmic contact with the P-type structure, as described in more detail below. Additionally, transistor 1500 includes a floating hole injector 1545 positioned on a source side of drain contact 333.

Similar to the embodiment illustrated in FIG. 11, transistor 1500 includes one or more hole injectors 1530 formed on substrate 105. Each hole injector 1530 can be formed with a P-type structure 325 disposed on substrate 105. In FIG. 15 a line of symmetry 1535 is used to show only a left-side portion of the drain region and a right-side portion is a mirror image of the right-side portion. P-type structures 325 can be arranged in repetitive islands that are disposed on both sides (i.e., left and right-sides of drain contact 333.

Transistor 1500 includes a dielectric layer 1510 that covers a portion of each P-type structure 325, with a remaining portion of each P-type structure forming an ohmic contact region 1505 with drain ohmic pad 335. In the embodiment illustrated in FIG. 15, dielectric layer 1510 covers approximately one half of P-type structure 325 however in other embodiments it can cover more than half or less than half of the P-type structure.

In some embodiments, drain ohmic pad 335 can be configured as a continuous metal layer that is (1) formed over and in contact with drain region 220 of substrate 105 to form a drain electrode 333, (2) formed over and in contact with a second portion of P-type layer 325 to form a hole injection electrode 375, and (3) formed over and in contact with a portion of dielectric layer 1510 to form a field plate 1515 for the hole injection region. In other embodiments one or more separate, but electrically coupled metal layers can be used in place of the aforementioned continuous metal layer. In the embodiment illustrated in FIG. 15, field plate 1515 extends across at least a portion of dielectric layer 1510, and in some embodiments extends until it is coplanar with a source-side edge 1550 of P-type layer 325 while in other embodiments it extends past the source-side edge of P-type layer 325. In one embodiment field plate 1515 extends past source-side edge 1550 of P-type layer between 0.125 microns and 2 microns, while in other embodiments it extends past between 0.2 and 0.75 microns.

In some embodiments a plurality of individual hole injectors 1530 are formed along a length of drain region 220 forming a series of sequential hole injector islands. Drain ohmic pad 335 may also extend in-between the individual P-type structures 325 to contact substrate 105 forming portions of drain contact 333, similar to the structure illustrated in FIG. 10.

In some embodiments a second field plate 385 can be positioned above field plate 1515, and a third field plate 395 can be positioned above the second field plate. The distal ends of field plates 1515, 385 and 395 can result in regions of high field strength 1540 that are identified by dashed circles.

In some embodiments an optional floating hole injector 1545 can be formed from a portion of P-type layer 325. Floating hole injector 1545 is not ohmically coupled to drain ohmic pad 335 and may be capacitively coupled to the drain ohmic pad. Floating hole injector 1545 may be positioned between hole injector 1530 and the gate region (see FIG. 11).

Figure 16:
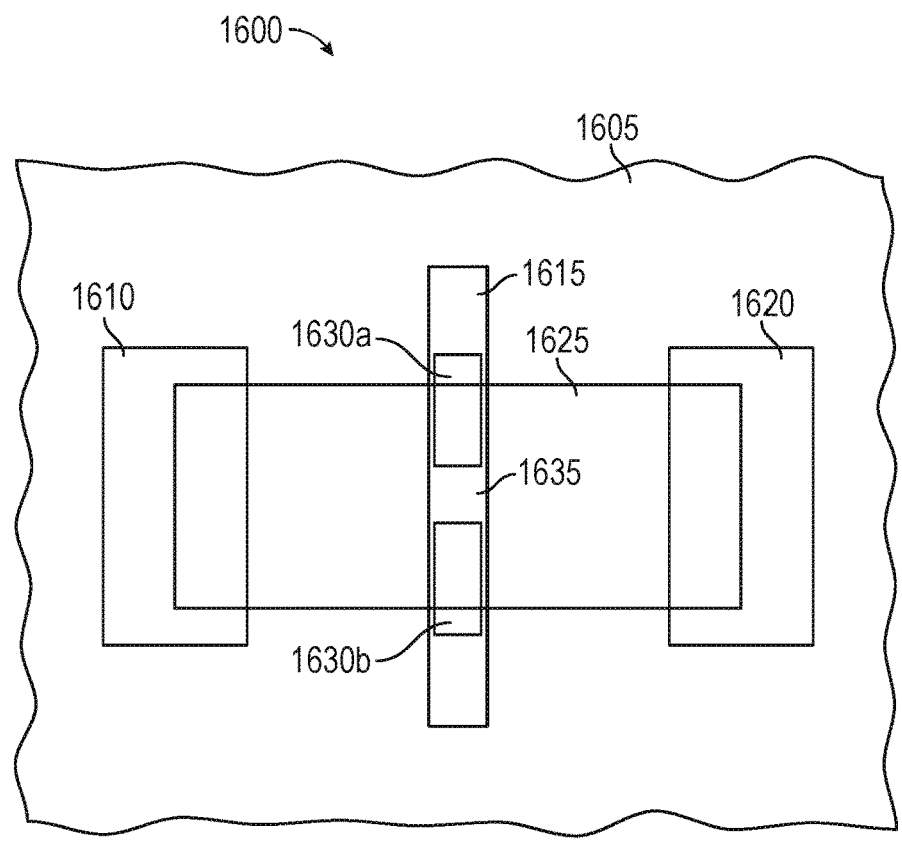
FIG. 16 illustrates a plan view of a GaN-based transistor according to an embodiment of the disclosure.

FIG. 16 illustrates a plan view of a GaN-based transistor 1600 according to another embodiment of the disclosure. Transistor 1600 is constructed similar to transistor 100 illustrated in FIGS. 1-3, however transistor 1600 includes a gate structure that is formed using P-type GaN islands, as described in more detail below. GaN-based transistor 1600 is fabricated on substrate 1605 that can be similar to substrate 105 in FIG. 1, and can include a source ohmic metal pad 1610 and a drain ohmic metal pad 1620 with a gate electrode 1615 and an active 2DEG region 1625 there between. Under gate electrode 1615 one or more P-type GaN islands 1630*a*, 1630*b* with gaps there-between can be disposed on substrate 1605. In various embodiments a single gate electrode 1615 can be formed across the one or more P-type GaN islands 1630*a*, 1630*b* and a contact between the gate electrode and the P-type GaN islands can be formed.

When zero voltage is applied to gate electrode 1615 with respect to source ohmic metal pad 1610, current flows through the 2DEG layer between the P-type GaN islands 1630*a*, 1630*b* in region 1635. When a positive gate voltage is applied, a 2DEG is formed under the P-type GaN islands 1630*a*, 1630*b*, and current can flow across the entire width of the active 2DEG region under the gate. If gate electrode 1615 is biased negative with respect to source ohmic metal pad 1610, the gap between the P-type GaN islands 1630*a*, 1630*b* will form a reverse biased junction around the P-type GaN islands. This reverse-biased condition forms a depletion region around each P-type GaN island 1630*a*, 1630*b* and limits the electron flow through region 1635. The more negative gate electrode 1615 is biased relative to source ohmic metal pad 1610 the more resistive region 1635 becomes until transistor 1600 pinches off all current flow. Therefore, P-type GaN islands 1630*a*, 1630*b* form a gate structure that controls current flow through the transistor channel. This also allows the structure to block voltage applied to the drain 1620 and so limits the electric field on the source side of the gate. This is a similar electric field limiting effect that is accomplished by the P-type GaN structures 1205 illustrated in FIG. 12.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A transistor comprising:
   a semiconductor substrate;
   a source region formed in the substrate and including a source electrode in contact with a portion of the substrate;
   a drain region formed in the substrate and separated from the source region;

a gate region formed in the substrate and including a gate stack in contact with a portion of the substrate, the gate region positioned between the source region and the drain region;

a hole injection region formed in the substrate and including a P-type layer in contact with a portion of the substrate, the hole injection region positioned between the gate region and the drain region;

a dielectric layer formed over and in contact with a first portion of the P-type layer; and a continuous metal layer made from a uniform material that is (1) formed over and in contact with the drain region of the substrate to form a drain electrode, (2) formed over and in direct contact with a second portion of the P-type layer to form a hole injection electrode, and (3) formed over and in contact with a portion of the dielectric layer to form a field plate for the hole injection region.

2. The transistor of claim 1 wherein the continuous metal layer extends across the drain region of the substrate, abuts a first side surface of the P-type layer and extends across a first region of a top surface of the P-type layer.

3. The transistor of claim 2 wherein the dielectric layer extends across a surface of the substrate, abuts a second side surface of the P-type layer and extends across a second region of the top surface of the P-type layer.

4. The transistor of claim 3 wherein the field plate extends across the dielectric layer and terminates before becoming coplanar with the second side surface of the P-type layer.

5. The transistor of claim 1 wherein the continuous metal layer is in ohmic contact with the P-type layer.

6. The transistor of claim 1 further comprising a plurality of individual hole injection regions formed along a length of the drain region.

7. The transistor of claim 1 wherein the hole injection region is a first hole injection region and a second hole injection region is formed in the substrate and positioned between the first hole injection region and the gate region.

8. The transistor of claim 7 wherein the second hole injection region includes a P-type layer that is in contact with a portion of the substrate and is not in ohmic contact with the continuous metal layer.

9. The transistor of claim 1 wherein the continuous metal layer is formed over approximately one half of a top surface of the P-type layer and the dielectric layer is formed over a remaining portion of the top surface of the P-type layer.

10. The transistor of claim 1 wherein the semiconductor substrate comprises gallium nitride.

11. A transistor comprising:

a semiconductor substrate;

a source region formed in the substrate and including a source electrode in contact with a portion of the substrate;

a drain region formed in the substrate and separated from the source region;

a gate region formed in the substrate and including a gate stack in contact with a portion of the substrate, the gate region positioned between the source region and the drain region;

a hole injection region formed in the substrate and including a P-type layer in contact with a portion of the substrate, the hole injection region positioned between the gate region and the drain region;

a dielectric layer extending across a first region of a top surface of the P-type layer; and a metal layer that (1) extends across a drain region of the substrate to form a drain electrode, (2) abuts a first side surface of the P-type layer and is in direct contact with a second region of the top surface of the P-type layer to form a hole injection electrode, and (3) extends across a portion of the dielectric layer to form a field plate.

12. The transistor of claim 11 wherein the field plate is a hole injection region field plate.

13. The transistor of claim 12 wherein the dielectric layer extends across a surface of the substrate, abuts a second side surface of the P-type layer and extends across the first region of the top surface of the P-type layer.

14. The transistor of claim 13 wherein the field plate extends across the first region of the dielectric layer and terminates before becoming coplanar with the second side surface of the P-type layer.

15. The transistor of claim 11 wherein the metal layer is in ohmic contact with the P-type layer.

16. The transistor of claim 11 further comprising a plurality of individual hole injection regions formed along a length of the drain region.

17. The transistor of claim 11 wherein the hole injection region is a first hole injection region and a second hole injection region is formed in the substrate and positioned between the first hole injection region and the gate region.

18. The transistor of claim 17 wherein the second hole injection region includes a P-type layer that is in contact with a portion of the substrate and is not in ohmic contact with the continuous metal layer.

\* \* \* \* \*